United States Patent [19]

Lubinsky et al.

[11] Patent Number: 5,105,451
[45] Date of Patent: Apr. 14, 1992

[54] ELECTROGRAPHIC PROCESS UTILIZING FLUORESCENT TONER AND FILTERED DETECTOR FOR GENERATING AN ELECTRICAL IMAGE SIGNAL

[75] Inventors: Anthony R. Lubinsky, Webster; John W. May, Rochester, both of N.Y.

[73] Assignee: Eastman Kodak Company, Rochester, N.Y.

[21] Appl. No.: 541,691

[22] Filed: Jun. 21, 1990

Related U.S. Application Data

[63] Continuation-in-part of Ser. No. 280,793, Dec. 7, 1988, abandoned.

[51] Int. Cl.$^5$ .................. B41M 5/00; G03G 13/22
[52] U.S. Cl. .................................. 378/28; 378/32; 378/44; 430/54; 250/315.3
[58] Field of Search ............... 378/28, 31, 30, 32, 378/37, 44; 355/228, 229, 232, 233, 240, 246; 250/315.3, 327.2; 430/54, 31

[56] References Cited

U.S. PATENT DOCUMENTS

| | | | |
|---|---|---|---|
| 4,038,943 | 8/1977 | Nelson et al. | 378/28 |
| 4,624,543 | 11/1986 | Young et al. | 355/240 |
| 4,743,758 | 5/1988 | Chan et al. | 250/327.2 |
| 4,752,944 | 6/1988 | Conrads et al. | 378/28 |
| 4,877,699 | 10/1989 | Young et al. | 430/54 |
| 4,939,759 | 7/1990 | Rupp et al. | 378/28 |
| 4,950,569 | 8/1990 | May | 378/28 |

Primary Examiner—Janice A. Howell
Assistant Examiner—Kim-Kwok Chu
Attorney, Agent, or Firm—William F. Noval

[57] ABSTRACT

An electrical image signal is produced by an electrographic process including the steps of forming a differential voltage pattern; developing the voltage pattern with a luminescent toner; exciting the developed image to emit radiation; and photoelectrically detecting the emitted radiation to produce an electrical image signal.

92 Claims, 2 Drawing Sheets

FIG. 1

ELECTROGRAPHIC PROCESS UTILIZING FLUORESCENT TONER AND FILTERED DETECTOR FOR GENERATING AN ELECTRICAL IMAGE SIGNAL

CROSS-REFERENCED TO RELATED APPLICATIONS

This application is a Continuation-in-Part Application claiming priority of U.S. Ser. No. 280,793 filed Dec. 7, 1988, now abandoned in the names of A. R. Lubinsky and J. W. May.

Reference is herebymade to commonly-assigned U.S. patent application Ser. No. 236,411 now U.S. Pat. No. 4,877,699, entitled "Electrophotographic Luminescent Amplification Process" filed Aug. 25, 1988 in the names of Ralph H. Young and John W. May.

TECHNICAL FIELD OF THE INVENTION

The present invention relates to electrography, and in particular to a process for generating an electrical image signal from an electrographic image.

BACKGROUND OF THE INVENTION

The conventional electrophotographic process has an inherently lower gain than the silver halide photographic process. A low exposure in an electrophotographic process results in a small amplitude differential voltage pattern on a photoconductor, and when developed with conventional toner, the resulting image is of low density. It has been a longstanding goal to increase the gain of the electrophotographic process so that higher density images may be produced from low exposures. This is of particular concern in applications such as diagnostic xeroradiography, where the exposing x-rays pose a potential health threat to the patient, and the lowest exposure possible is desired. It has also been a goal to produce an electrical image signal from an x-ray image so that the image signal can be electronically processed to enhance the visibility of certain features, stored in an electronic form, or transmitted electronically to a remote location.

Increases in gain or photographic speed are also desirable in other electrographic processes. As, used here, electrographic processes are processes in which differential patterns of voltage, charge, current or conductivity are developed with toner. Electrographic processes include, for example, dielectric recording, photoconductography, electrophotography, photoelectrophoresis, ionography, It has been proposed in U.S. Pat. No. 4,624,543 issued Nov. 25, 1986 to Young et al. to generate an electrical image signal by exposing a photoconductor to produce a differential voltage pattern on the photoconductor, developing the image on the photoconductor with a conventional liquid toner employing a development electrode, scanning the developed image with a beam of light, and detecting the modulation of the light beam by the developed image. Light that strikes the untoned portion of the image is specularly reflected from the surface of the photoconductor. Light that strikes the toner is diffusely reflected. The detector optics are arranged to detect only the specularly reflected portion of the light.

If the apparatus described in U.S. Pat. No. 4,624,543 is employed to generate an electrical image signal from a small exposure (for example a small x-ray exposure), the small exposure results in a toned image that is of very low density. Since the photodetector senses the modulation by the toner image of the specularly reflected light of the to detect for a low density image. The resulting electrical image signal is a complicated function of the optical properties of both toner and substrate.

Also, in the prior art method, the presence of a small coverage of toner is detected as the difference in two large signals: the reflectance signal from a clean photoconductor, and the slightly different reflectance signal from a photoconductor with a small coverage of toner. The resulting difference signal will be noisy. Further, the method is sensitive to slight scratches or imperfections on the surface of the photoconductor. Finally, the use of a Fresnel type lens to collect the specular light over a large scanning area, as taught in col 6, pp 47-55 of U.S. Pat. No. 4,624,543, will introduce unwanted ripples in the output signal which may interfere with the detection of small modulations in the toner coverage, thereby making the signal difficult to interpret.

Another limitation of the above process is the restriction to reflective substrates.

Another prior art method of generating an electrical image signal from an x-ray exposure is the storage phosphor technique described in U.S. Pat. No. Re. 31,847, reissued Mar. 12, 1985 in the name of George W. Luckey. In the storage phosphor approach a stimulable storage phosphor is exposed to a pattern of radiation to form a stored latent image. The stored image is read out by stimulating light, which releases a pattern of radiation that is detected to generate the image signal. This approach suffers process, in which the latent image is destroyed when is read out. Another drawback is that the stimulating exposure needed is relatively high, requiring expensive readout apparatus. Yet another drawback is the loss of resolution caused by scattering of the stimulating light in the stimulable phosphor.

It is therefore the primary object of the an electrical image signal from a low exposure in an electrophotographic process that is free from the shortcomings noted above. It is a further object of the invention to provide means of detecting very low coverages of toner produced image-wise by other electrographic methods such as ionography, stylus
of voltage, charge, current or conductivity is toned.

SUMMARY OF THE INVENTION

The object of amplifying an image in an electrographic process is achieved according to the present invention by forming a differential voltage pattern and developing with a toner containing luminescent material. (Herein, a material is termed luminescent if, when excited by radiation of a first wavelength, it emits radiation of a second different fluorescent compounds, scintillating compounds, etc.) The image-wise luminescent toner deposit is excited to produce emitted radiation. The emitted , radiation is photoelectrically detected employing a photodetector with a filter to block radiation of the first wavelength and pass radiation of the second wavelength to product an electrical image signal which, after electronic processing, can be used to create either a video image or a hardcopy output image.

According to a preferred mode of practicing the invention, the small amplitude differential voltage pattern or charge pattern is formed on a selenium photoconductor by small exposure to x-rays. The small amplitude differential voltage pattern or charge pattern is developed with a liquid luminescent toner, employing a development electrode. The luminescent toner image is excited by raster scanning with a laser beam or with a collimated light beam, and the emitted radiation is collected by a light collector and directed to a photomultiplier tube, produce the image signal. Since the exciting radiation can be blocked by a filter from reaching the detector, and only the emitted radiation sensed, the modulation of the resulting image signal is much improved over that produced by the prior art methods. For example, when the exciting radiation is ultraviolet and the emitted radiation is visible, an ultraviolet filter is employed. Moreover, the emitted radiation, coming as it does only from the toner, does not involve the substrate, so that the resulting electrical image signal is inherently much easier to interpret than signals produced by the method of Young et al. In addition, for weak exposures of the photoconductor and hence low toner coverages, the signal modulations need not be extracted from a difference of large values, nor are they combined with unwanted signal modulations due to use of a Fresnel lens, as in the detection method of U.S. Pat. No. 4,624,543.

In the preferred mode of practicing the invention in a xeroradiographic application, the toner particles have a size distribution between 0.4 and 1 μm in diameter, and the toner charge is such that at least 1 to 2 toner particles are deposited for each x-ray photon that is absorbed by the photoconductor. Because the toner particles are small resulting in a very thin toner layer, the present invention exhibits less scattering of the stimulating radiation and hence improved resolution over the previously cited stimulable phosphor method disclosed in U.S. Pat. No. Re. 31,847.

The decay lifetime of the fluorescence of the toner is preferably less than 0.1 μs, to facilitate readout of an image in a reasonably short time, e.g. 10 seconds.

In yet other modes of practicing the present invention, other electrographic processes can be used in which low amplitude image-wise voltage, charge, conductivity or current patterns are developed to increasing the sensitivity of, for example, photoelectrophoresis, ionography, stylus recording or ion projection. The luminescent toner particles may be developed from either a dry developer or from a liquid developer by means well known in the art.

DESCRIPTION OF THE INVENTION

Figure 1:
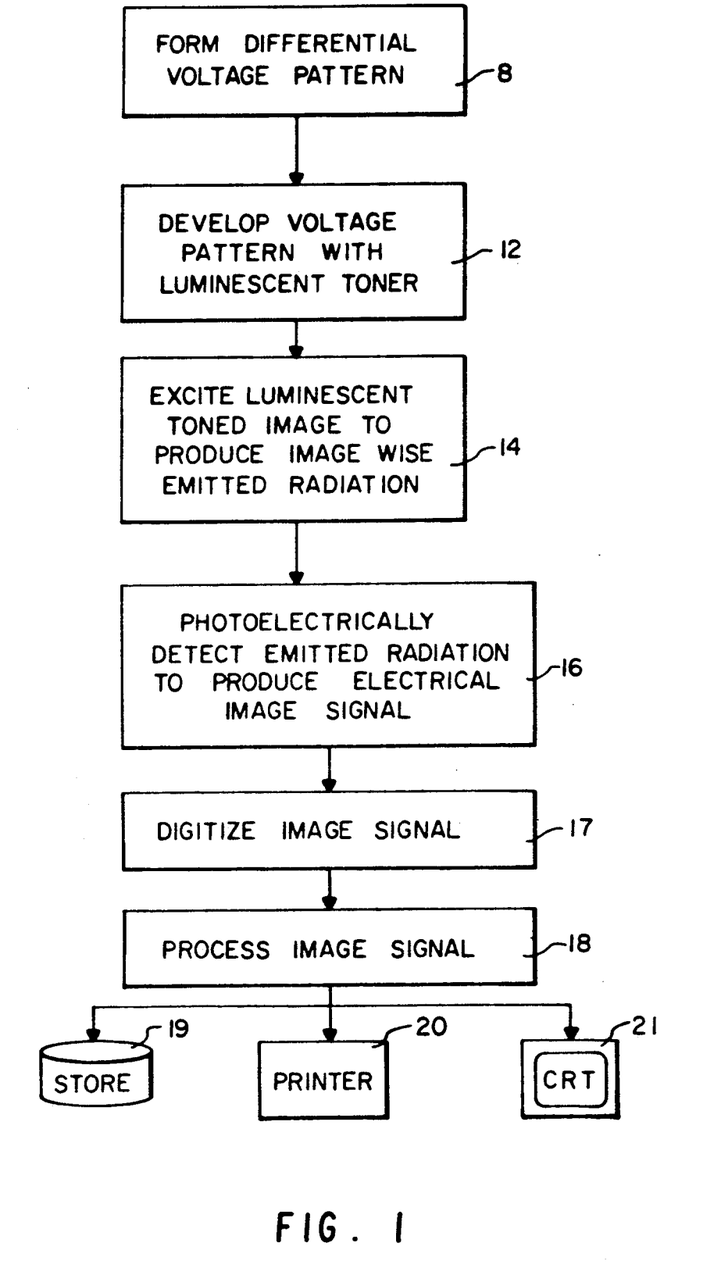
FIG. 1 is a flow diagram showing the steps of the electrographic process according to the present invention.
Figure 2A:
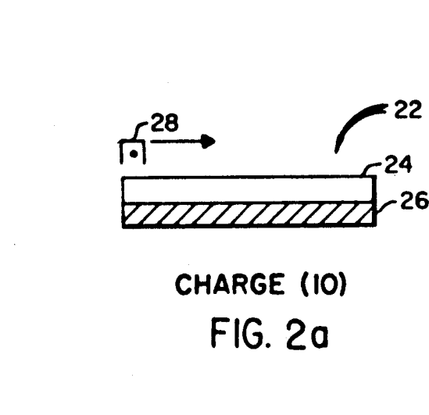
FIG. 2 is a schematic diagram showing the steps employed in the preferred mode of practicing the invention.
Figure 2B:
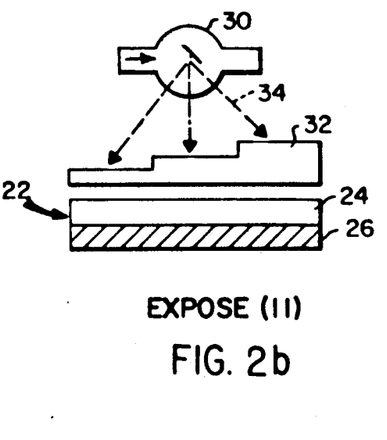
Figure 2C:
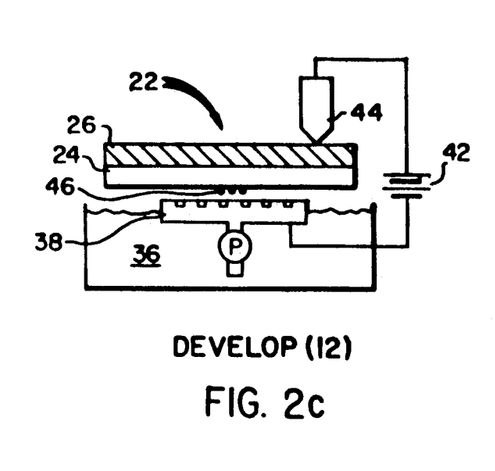
Figure 2D:
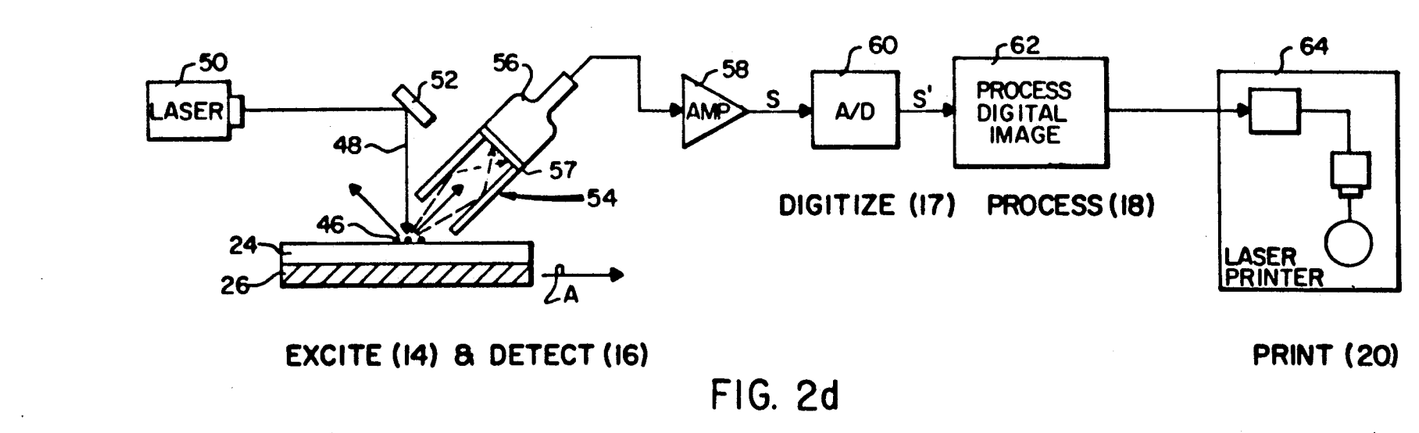

Referring to FIG. 1, the steps in the electrographic method of forming an electrical image signal according to the invention are shown. First, a voltage differential image is formed (8) by an electrographic process such as electrophotography, photoconductography or dielectric recording. In electrophotography, the photoconductor may comprise, for example, any photoconductor known in the art. Typical photoconductor films that can be used are made from sensitized organic dyes in polymeric binders, or from inorganic photoconductive particles such as zinc oxide or cadmium sulfide in organic binders. Photoconductive plates such as those made from selenium on a rigid support may also be used. Particularly useful for x-ray detection are photoconductors containing the heavier elements, including selenium, selenium-tellurium alloys, lead oxide, mercury iodide, bismuth oxide mixed with other oxides, and the like. Single layer or composite, multilayer photoconductive elements may be used.

The electrostatic latent image may be formed by charging and exposing the photoconductor to an imagewise pattern of radiation as is known in the art. The photoconductor may be charged to conventional voltage levels for the particular photoconductor or process, or to lower than normal charging levels for certain photoconductors to avoid the problems of dark decay noise or dielectric breakdown that occur in some photoconductors. The photoconductor may be exposed to normal or lower than image. Preferably a low amplitude differential voltage latent image is formed, in order to maximize the sensitivity or detectivity of the system by readout process.

In the context of the present application, the term "low amplitude differential voltage image" refers to a latent electrostatic image having a voltage differential that is lower than that considered in the prior art to be sufficient to produce a satisfactory image.

For example, the average entrance exposure for mammography as practiced in the prior art using xeroradiography with a selenium photoconductor was found to be about 1.0 Roentgens, using an x-ray beam with a half-value layer (HVL) of 1.1 mm of aluminum. Using the present method with the same type of x-ray beam having HVL of 1.0 mm of aluminum, a latent image may be formed on a selenium photoconductor with an x-ray entrance exposure of 0.12 Roentgens which results in a final output image of excellent contrast. Thus, in xeroradiography, the x-ray exposure employed to produce the low voltage differential image may be from one half to one tenth the exposure normally required to produce a diagnostically useful image in the particular photoconductor. The low voltage differential image may also be produced as a result of charging the photoconductor to a lower than normal level to avoid artifacts caused by excessive dark decay noise or by dielectric breakdown. Low voltage differential images may also be produced by normal level exposures of organic photoconductors, where the amount of organic photoconductor in a binder is reduced below that which is conventionally employed. Similarly, photoconductors which are not optimally responsive to particular wavelengths of exposing radiation may be employed with these wavelengths to produce a low amplitude differential voltage image.

The low amplitude differential voltage image is developed (12) with a luminescent toner. The image may be developed using any of the known electrophotographic development techniques such as liquid, dry magnetic brush or cloud development; however, for xeroradiography, liquid development with a development electrode is the presently preferred method. The luminescent toner material may comprise, for example, luminescent pigments, dyed lattices in which the dyes are luminescent or optical fluorescent polymers such as polymers containing fluorescing anthracene or other fluorescing units.

The developed luminescent toned image is excited (14) to produce emitted light. The presently preferred mode is to stimulate and detect the image pixel by pixel by scanning, the image in a raster fashion with a beam of exciting radiation. The scanning may be effected by any of the well known techniques for scanning an image with a beam of radiation.

The emitted luminescence is detected (16) to produce the electrical image signal. Preferably, for achieving the maximum signal to noise response, the image is excited pixel by pixel, and the emitted light is collected over a large solid angle and directed to a non-imagewise photoelectric sensor such as a photomultiplier tube, or photodiode.

The detected signal may be electronically amplified as is well known in the art to produce a final electrical image signal. As shown in FIG. 1, the image signal may then be digitized (17) and processed (18) for example by adjusting the tone scale, enhancing edges, removing noise, or compressing the digital image. The processed image may be stored (19) or displayed in known ways such as printing (20) or video display (21).

In the present method, modulations in toner coverage corresponding to voltage contrasts of less than 5% are easily detected and may be electronically enhanced, whereas in the prior art method U.S. Pat. No. 4,624,543 the sensitivity cannot be much greater than the artifact ripple in the signal itself, which is claimed to be 10% or less.

A presently preferred mode of practicing the invention for xeroradiographic application will now be described with reference to FIG. 2. In forming the differential voltage pattern, a photoconductor generally designated 22 comprising a selenium layer 24 on an aluminum support 26 is charged (10) to a positive potential by a corona charger 28. Selenium plates were obtained from Noranda Research Center, Quebec, Canada. Plates are prepared by vacuum evaporation of selenium onto an aluminum support that has been provided with a barrier layer to prevent electron injection from the aluminum into the selenium when the plate is positively charged by a corona charger.

An x-ray source 30 is employed to expose (11) an object 32 to s-rays 34. The x-rays are modulated by the object, and impinge upon the photoconductor 22 to produce a low amplitude differential voltage image on the photoconductor 22. Typical exposure conditions for a mammogram employing the present invention would be 40 kVp (1.0 mm Al HVL) and 0.12 Roentgens, compared to 50 kVp (1.2 mm Al HVL) and 1.0 Roentgens for a conventional xeroradiographic mammogram.

Since in the present method the amount of x-ray exposure required is not determined by the need to achieve a high level of toner density, but only by the need to produce a detectable electrical signal having sufficient signal-to-noise ratio (SNR), the exposure may be greatly reduced.

The low amplitude differential voltage image on the photoconductor 22 is developed (12) with a liquid developer 36 employing a development electrode 38 as shown in above referenced U.S. Pat. No. 4,624,543. The development electrode is connected to one terminal of a voltage source 42. The other terminal of the voltage source is connected to an electrode 44 that contacts the aluminum support 26 which serves as a backside electrode of the photoconductor 22.

For xeroradiography the liquid toner comprises fluorescent toner particles suspended in a carrier liquid, having a preferred size distribution of between 0.4 and 1 $\mu$m and having a charge such that at least 1 to 2 toner particles are deposited on the image per absorbed x-ray photon and having a fluorescent decay lifetime $\tau$ of equal to or less than 0.1 $\mu$s where the fluorescent decay is modeled by the exponential:

$$I = I_o \exp(-t/\tau) \qquad (1)$$

I is the fluorescence at time t after cessation of excitation and $I_o$ is the fluorescence during excitation. The toner was prepared as described below in example 2.

The small particle size and a process sensitivity of at least 1-2 particles per photon are important to provide the highest possible resolution, and to provide the ability to detect threshold x-ray exposures with a high degree of statistical certainty.

The fast decay lifetime is important so that reasonably short time with a high signal to noise ratio.

The toned image may be rinsed (not shown) carrier liquid to remove excess toner from the photoconductor. After rinsing, the toned image is dried (not shown) as is known in the prior art.

In the preferred mode, the toned image 46 is light 48 generated by a laser 50. The laser beam is deflected by a mirror or polygon 52, while the photoconductor is moved in the direction of arrow A to effect a raster scan of the luminescent toned image 46. Light emitted from the image is collected and detected (16) by a light collector of the type comprising a mirror box 54 to collect the emitted light and direct it to a photomultiplier tube (PMT) 56 or photodiode. A filter 57 over the face of the PMT blocks exciting radiation and passes emitted radiation. Examples of such a light collector/detector useful with the present invention are shown in U.S. Pat. No. 4,743,758 issued May 10, 1988 to Chan et al. and U.S. Pat. No. 4,743,759 issued May 10, 1988 to John C. Boutet.

As is well known in the art, the electrical image signal S produced by the photomultiplier tube may be amplified by an amplifier 58, and digitized (17) by an analog to digital convertor 60 and digital image processing electronics 62. The digital image processing electronics 62 may implement any of the known digital image processing operations on the digital image signal, such as tone scale adjustment, edge enhancement, and noise reduction.

The above described scanning method can also be employed to detect electrical noise due to non-uniform corona charging of a photoconductor caused by a permanent non-uniform dark conductivity pattern in the photoconductor, and characteristic of a given photoconductor film sample or plate. The conductivity pattern is further amplified when the charged photoconductor is stored in the dark, resulting in an overall "dark decay" pattern of charge or voltage on the photoconductor. The dark decay pattern is detected by charging photoconductor 22, for example, by corona charger 28 and then bias-developing, without exposure of the photoconductor, a thin layer of toner by means of the development electrode 38 the potential of which is set at a convenient offset voltage from the average surface potential of the corona charged photoconductor. After rinsing and drying by the method described, the dark decay pattern now decorated by toner is scanned, allowing electronic storage of the locations and amplitudes of noise fluctuations due to the dark decay pattern of the given photoconductor. The image of this pattern, in electronic digitized form, can be manipulated electronically, e.g. its amplitude adjusted, and then subtracted from subsequent images made by image-wise exposures, thereby reducing the noise in the output images created from the stored electrical images.

The above scanning method can also be used to scan a toned image a first time in order to optimally adjust the detective gain, in order to avoid the loss of any image information due to clipping, e.g., in a subsequent scan.

Detective gain is the ratio of the signal produced (e.g. in volts) to N/A, where N/A is the number of toner particle N per area A. When an image is excited by a scan beam of intensity $E_o$, detected by a photomultiplier having an amplification $\eta g$ (where $\eta$ is the quantum efficiency of the photocathode and g is the amplification of the electron multiplier stages of the photomultiplier), and converted to voltage by a transimpedance amplifier with transimpedance R, the output signal in volts S will be $$S = I[N/A] \cdot \eta \cdot g \cdot R. \quad (2)$$

where I is the intensity of the emitted fluorescence, $$I = f \cdot N/A \cdot E_o \quad (3)$$

where f is a factor relating fluorescence to stimulation intensity.

Therefore, $$S = E_o f \cdot \eta \cdot g \cdot R \cdot N/A \quad (4)$$

From equation 4, it can be seen that the gain producing the signal S can be adjusted by varying the intensity $E_o$ of the stimulating radiation, the multiplication factor $\eta g$ of the PMT, or the transimpedance R of the amplifier.

The processed image signal may be either stored for future use, or displayed for example by a laser film printer 64.

After the toner image on the plate is no longer needed, it may be cleaned off so that the photoconductor can be reused. Any suitable cleaning method can be employed, including the use of solvents, agitation (including ultrasonic agitation), or mechanical methods such as using a brush, skive, or wiper, or any other method known in the art. As an adjunct to the cleaning operation described above, the scanning method can also be used to advantage to prescan the cleaned photoconductor and subsequently to subtract electrically, analogously to the method described above for dark decay noise, the signal corresponding to any toner residue left from a previous image. This will prevent ghost images from interfering with the latest image being scanned.

EXAMPLES

Example 1. Samples of photoconductor film containing an organic photoconductive dye in a polyester binder, and available from the Eastman Kodak Company as photoconductive film type SO-101, were positively charged and exposed to a test pattern simulating a standard x-ray mask test target with sets of lines ranging in frequency from 0.05 to 3.7 cycles per mm, to simulate low intensity x-ray exposures, and to form low amplitude differential, voltage images on the photoconductor. The images were toned with a liquid developer containing Rhodamine 6G dye dissolved in a cellulose acetate-co-cyclohexene orthodicarboxylic acid polymeric binder (CAP-6). The dye was chosen for excitation by an Argon ion laser at a wavelength of 488 nm. The toner was prepared as follows: A 64% by weight solution containing 0.2 g of Rhodamine 6G plus 5.8 g of said binder was added to heptane to yield a precipitate comprising a solid solution of dye in binder. The heptane contained a dispersant which aided formation of small particles but which remained in solution and did not coprecipitate. After filtering and drying, one part by weight of the particles was ball-milled in ISOPAR G with one part by weight of the charge stabilizing polymer t-butyl styrene-co-stryene-co-lithium-sulfoethyl methacrylate and 0.1 part t-butyl styrene-co-lithium methacrylate 1.5 $\mu$m, with mean size 1 $\mu$m. In Table I, below, this toner is identified as 1X concentration of dye. A similar toner, identified as 2X, was made as above but using 0.4 g of Rhodamine 6G plus 5.6 g of binder in the first step of preparation. Four comparative low voltage images were made as indicated in Table I. Film samples were charged to approximately +200 volts, exposed with white light for the listed times, and developed for approximately 30 seconds in the neg/pos mode, using a pumped, slotted development station which was biased to the potentials $V_b$ listed in Table I. "Neg/pos mode" means that the charge pattern was developed such that the exposed areas of the image receive toner. The white light exposures were chosen to drive the surface potential on the film to a voltage lower than $V_b$ in each case.

TABLE I

Images on SO-101 Photoconductor

| Image No. | Developer | Equivalent $\Delta V$ Developed (volts) | Equivalent $\Delta Q$ Developed (nC/cm$^2$) | Minimum Spatial Frequency For Complete Development (cycles/mm) |
|---|---|---|---|---|
| 61-11 | 1X | 34 | 9.2 | 0.1 |
| 62-10 | 2X | 13 | 3.4 | 0.2 |
| 62-19 | 1X | 12 | 3.2 | 0.6 |
| 62-14 | 2X | too low to measure | 1 | 0.9 |

The last column provides a qualitative measure of completeness of development of solid areas; the low frequency limit of about 0.1 cycles/mm for image 61-11 indicates close to 100% development of the available voltage differential for all practical frequencies. At the other extreme, image 62-14 showed hollowing out of bars (edge-development) for frequencies lower than 0.9 cycles/mm and nearly 100% development for higher frequencies.

From the measured magenta optical densities of the toner in areas having uniform toner laydown, it was possible to estimate the developed potential difference $\Delta V$ between exposed and unexposed areas of the film. This was done by comparison of these densities with the measured optical densities obtained using a standard carbon toner liquid developer of calibrated sensitivity, under identical conditions of exposure and development parameters. The corresponding $\Delta Q$ values in Table I were then calculated from the SO-101 film capacitance. Equivalent $\Delta V$ values that would be produced by the same $\Delta Q$ values on a selenium plate, typically 320 $\mu$m thick, are 530, 195, and 184 volts (corresponding to 34, 13, and 12 volts on SO-101, respectively). For a plate charged to 3200 volts, corresponding percentage discharges are 17, 6, and 6, respectively, showing that sufficient sensitivity was obtained to provide more than adequate detection of contrast in xeroradiographic mammography, insofar as the image 62-14, which had optical density too low to measure, was nevertheless easily visible by eye without any amplification.

Observations of all the images of Table I by eye showed excellent resolution and sharpness down to the limit of the radiological test pattern of 3.7 cycles/mm.

Under UV excitation (365 nm) the toned areas in all cases were seen by eye to glow in yellow fluorescence, whilst untoned areas did not appear to. Quantitative measurement of fluorescence was made on image 62-10, using narrow-band excitation centered at 488 nm. The emission spectrum showed a broad band, with a threshold near 520 nm, $\lambda_{max}$ at 568 nm, and extending beyond 700 nm. The fluorescence of the background, or nominally untoned areas of the image, had an amplitude of about 2% of that of toned areas, and the peak shape was the same, showing that the background material was not different from that in toned areas.

Image 62-10 was scanned using an argon ion laser of beam width $100\pm5$ μm in a laser scanner having a light collector comprising an integrating cylinder with filters, and photomultiplier tubes arranged at the two ends of the cylinder. The luminescent signal was sampled at 100 μm spatial intervals, filtered electronically to remove high frequency noise, and digitized using a 12-bit analog-to-digital converter. The resulting video image was displayed on a CRT. The digitized image was also sent to a drum scanner/printer, and printed on silver halide film having blue tinted support, to simulate a conventional medical radiograph.

The print from image 62-10 was made at unit magnification, and showed an excellent rendition of the original. The 3.7 cycles/mm bars (135 μm bars and 135 μm spaces) were cleanly separated and sharp. The print also contained a step wedge, in which $D_{max}=0.7$ ND corresponded to ten times the exposure of the bars and hence to complete development of the available potential difference of 40 volts (Table I).

EXAMPLE 2

An improved toner was made using Rhodamine 6G as the fluorescent material. Rhodamine 6G (0.6 g) and CAP-6 binder (11.4 g) were precipitated by the method of Example 1 to produce a pigment melt-compounded with f20 g of a polyester binder and 10 g of a 1:1 mixture of low molecular weight polyethylene wax/ELVAX [poly(ethylene-co-vinyl acetate) from Dupont Company], coarsely pulverized, and then milled with stabilizer polymers to produce a developer concentrate. A developer was produced by dilution with purified ISOPAR G. The new developer had much improved shelf-life.

Images were made on SO-101 film using the same test pattern as Example 1. The procedure was similar to that of Example 1, namely, charging the film positively to potential $V_o$ volts with a corona charger, exposing with white light through the test pattern, and developing in neg/pos mode in a liquid developer station having a development electrode at potential $V_b$.

In all images with the new toner, the bar patterns were sharply resolved down to 3.7 cycles/mm. After scanning and forming silver halide hardcopy output, the output prints were examined, and in all cases showed similar sharpness and resolution at 1:1 reproduction. The low frequency bars (or patches) showed good fill-in and large area uniformity.

The small developed ΔV of the image bars was calculated accurately by measuring the magenta transmission density of the low frequency bars, and using a calibration curve of density versus developed voltage measured separately (see Table II).

TABLE II

Images With Improved Toner on SO-101 Photoconductor

| Image No. | Developed ΔV (volts) | Net Toner Magenta Trans. Density | Output Printout Trans. Neutral Density (Net) | Maximum Fluorescent Signal (Arb. Units) |
|---|---|---|---|---|
| 194-7 | 20 | 0.15 | 0.72 | 7 |
| 194-8 | 22 | 0.17 | 0.87 | 6½ |
| 195-1 | 30 | 0.22 | 1.18 | 8 |
| 195-2 | 32 | 0.24 | 1.31 | 7 |
| 194-6 | 40 | 0.29 | 1.46 | 10 |

It is evident from Table II that magenta optical densities of toner are small, corresponding to very small developed ΔV value that are approximately 10 times lower than are normally used to form conventional xerographic images. Electronic tone scale adjustment was used to produce output printout densities close to 5 times the input densities in all cases, with a linear relationship between the magenta toner densities (proportional to toner laydown coverage) and the output silver developed in the hard copy film. Different electronic gain would have produced proportionately different output silver densities from the same toner images.

EXAMPLE 3

This example demonstrates that dry luminescent toner can be useful in the practice of this invention, especially for non-radiological imaging purposes. A two-component developer was prepared, consisting of oxidized iron core particles (diameter approximately 150 μm) mixed with ground polyester fluorescent toner particles (diameter approximately 15 μm) at 8% w/w toner concentration. The toner formulation consisted of VITEL 10038A polyester binder from Dupont Company, containing 0.2% w/w of the methyl ester of Rhodamine B trifluoromethanesulfonate and 1.0% w/w of charge agent. The charge agent is disclosed in co-pending U.S. patent application 134,344 by D. Bugner et al., filed Dec. 17, 1987, and consists of octadecyldimethylbenzylammonium metanitrobenzenesulfonate. The toner charged negatively with the said carrier. Images were made using an experimental film similar to SO-101, having a thin thermoplastic overcoat. The film was charged positively with a corona charger to 585 volts, exposed down to a potential of 300 volts by white light through a test pattern of the opposite polarity of Example 2, and developed using a conventional magnetic brush station biased at potential $V_b$ to give a pos/pos reproduction of the test pattern on the film, as summarized in Table III.

TABLE III

Dry Toner Images

| Image No. | Development Process Speed (ips) | Solid Area Developable ΔV (volts) | Magenta Transmission Density | Developed ΔV (volts) |
|---|---|---|---|---|
| 153-1 | 0.5 | 85 | 0.11 | 50 |
| 153-2 | 0.25 | 85 | 0.19 | 86 |
| 153-3 | 0.25 | 45 | too low to measure accurately | 10 (estimated) |

Referring to Table III, image 153-1 was incompletely developed, so that low frequency bars showed enhanced edge development as well as directionality effects associated with transport through the developer station. Nevertheless, solid area laydown was judged to be fairly good. Increasing the development time for image 153-2 resulted in complete development. The much weaker toning fields in image 153-3 were close to threshold for solid area development to occur, resulting in very fringy incomplete development of low frequency bars, with full bar development occurring only at frequencies higher than 1.4 cycles/mm. At the higher frequencies, all images showed sharp resolution and clean edged lines.

Images were scanned as in Example 2, giving output prints that were faithful reproductions of the original images. The output transmission neutral densities (net) of images 153-1 and 153-2 were 0.60 and 0.90, respectively, demonstrating electronic contrast enhancement factors of 5.5 and 4.7 for the scanning and outputting gains used. These gains, as described earlier in this document, are variable over wide ranges and can be considerably larger than

EXAMPLE 4

A selenium plate, 0.15 mm thick, obtained from Noranda Research Center, Quebec, Canada was charged to a potential of +2250 volts and placed in a light-tight box. An x-ray beam from a Picker single-phase, W anode x-ray machine, operated at 30 kVp with a measured half-value layer thickness of 0.55 mm of aluminum, was used to expose the plate after transmission through a standard KODAK-PATHE radiographic test phantom. The test phantom consisted of a plastic disk 1.3 cm thick, in which were embedded various objects such as wire meshes, plastic balls, and fine fibers. Below this was added 2.4 cm thickness of plastic resin LUCITE sheets, for a total phantom thickness of 3.7 cm. The entrance x-ray exposure was 0.291 R, as measured with an air ionization chamber. For comparison, the x-ray exposure required to obtain a 1.14 film density with a KODAK Ortho M film and min R screen, using a LORAD x-ray machine with a Mo anode at 28 kVp, and using the same test phantom, was 0.389 R.

The plate was then toned with a similar liquid developer as in Example 2. A different Rhodamine dye was used, namely the methyl ester of Rhodamine B trifluoromethanesulfonate. The preparation procedure was identical to Example 2, except that the following ingredients and proportions were used: 0.4 g dye, 19.6 g CAP-6, 30 grams polyester binder, and 16 g of 1:1 wax-/ELVAX. This toner was improved over that of Example 2 by having brighter fluorescence. The development electrode bias was set at 160 volts above the average plate surface potential in the region where the plate had been exposed through the test phantom. The plate was dried, and a clear but low density toner image was on the plate.

In another series of experiments, it was verified that a clear toner image could still be produced when both the energy and the incident exposure of the x-ray beam were varied in wide ranges; in particular where the energy was increased from 30 kVp to 50 kVp (at constant dose to the phantom), and when the exposure was increased from 0.29 R to 0.66 R (at 30 kVp).

The toned plate was then scanned with an Ar ion laser (Spectra-Physics Model 162-03) at 488 nm in a scanner equipped with a rotating polygon to deflect the laser beam, a translation stage to move the plate, a reflective light collector as described in U.S. Pat. No. 4,743,759, two PMT's (Hammamatsu type R1512) with colored glass filters (Schott OG-530 from Schott Glass Technologies Inc., Durea, PA.), and a high-speed data acquisition system with a 12-bit A/D converter to digitize the signals and a magnetic disk to store the image data. The pixel size in both directions was 100 $\mu$m, and the $1/e^{**}2$ diameter of the scan beam was 100 $\mu$m. The power in the beam at the sample plane was 0.27 milliwatt, and the polygon rotated at 429 rpm. The number of lines scanned was 1500, the number of pixels/line was 1500, and the time to scan the image area was about 6 seconds.

The digital image data were processed in several ways, to enhance the appearance of the output images. These included tone scale processing to enhance the contrast in the output image; remapping to display the output image with reversed tone polarity (i.e., "black-bone" vs. "white-bone"), and pixel interpolation to display a magnified output.

The processed image data were sent to a laser film printer, and output prints were created on blue-tinted film, which were viewed in transmission on a light box. The processed images were also displayed and viewed on a CRT screen. The images may also be written on photographic paper and viewed in reflection, or some other form of hard copy display may also be used including electrophotographic, thermal transfer, ink jet, or the like. The output images were of high contrast, and all the various types of objects in the test phantom including wire meshes, plastic balls, and fine fibers were clearly visible. The output image contrast was adjustable by tone scale processing and could be made equal to or higher than that in a comparison image made by conventional film-screen radiographic technique. In addition, the visibility of fine details could be enhanced in the output image by magnification.

It is an important feature of the present invention that the fluorescent decay lifetimes of the fluorescent toners are relatively short, thereby facilitating relatively fast scanning readout of the image. If the scanned pixel size is represented as a square of side p, the residence time $t_{res}$ of the scanning beam on each pixel is given by $$t_{res} = \frac{p^2 \cdot t_{read}}{A_{total}}, \qquad (5)$$

where $t_{read}$ is the total readout time of the image, and $A_{total}$ is the total area of the image.

If $p = 50$ $\mu$m, $t_{read} = 10$ sec., and $A_{total}$, the area of a typical mammographic plate, is (23.5 × 18 cm), $$t_{res} = \frac{(50 \times 10^{-4} \text{ cm})^2 \times 10 \text{ sec}}{23.5 \times 18} = 1.5 \text{ } \mu\text{sec.} \qquad (6)$$

Thus, for a mammographic application, the decay time of the fluorescence of the toner must be less than 1.5 $\mu$ sec.

In particular, it can be easily shown that, if the decay of the afterglow fluorescence is exponential, as in equation (1), then the modulation transfer function MTF which describes the resultant image degradation is given by:

$$\text{MTF}(\nu) = [1 + 2\pi i x_o \pi]^{-1} \qquad (7)$$

Here $x_a = v\tau$, where v is the (fast-)scan velocity and $\tau$ is the fluorescent decay lifetime and $\nu$ is spatial frequency. Taking v as $p/t_{res}$, we may calculate the real part of the MTF above, which gives the amount of image blur due to afterglow:

$$R[MTF] = \left[1 + \left(\frac{2\pi p \tau \nu}{t_{res}}\right)^2\right]^{-1} \quad (8)$$

Using equation (8) we may find the fluorescent decay lifetime $\tau$ which results in a given MTF loss due to afterglow, at a particular spatial frequency $\nu$. For example, to give MTF 99% at $\nu=2$ cycle/mm, with a residence time of 1.5 μsec and a pixel width p of 50 μm, we require $\tau$0.24 μsec. To give MTF 90% at a spatial frequency of 20 cycles/mm, we require $\tau$0.08 μsec.

For comparison, the fluorescent decay times of materials typically employed in computed radiography using stimulable phosphors is about 0.8 μsec.

Also, we may note that since the image degradation in equation (7) due to an exponentially decaying fluorescence is causal and one-dimensional, it may in principle be removed by an inverse filter:

$$H(\nu) = 1 + 2\pi i\, x_a \nu \quad (9)$$

The transfer function which corresponds to this filter is its Fourier transform:

$$T(x) = \delta(x) + x_a \frac{d}{dx} \quad (10)$$

Thus the blurring may be removed and the "true" data recovered from the "blurred" data by operating with the above transfer function. This transfer function may be implemented in computer software, or electronically. The presence of the derivative in equation (10) makes clear however, that the restoration filter increases noise at the same time as it removes blur. In the case of radiographic imagery, which is intrinsically noisy due to the presence of "quantum mottle," it is clear that the preferred approach is to reduce blurring by limiting the fluorescent decay lifetime. For the present application then, it is preferred that the decay lifetime of the fluorescence of the toner be less than 0.1 μsec.

The fluorescent toners described above have fluorescent decay lifetimes of less than 1 nsec, and are thus well suited for use in a computed radiography apparatus.

Also, in order to reduce the size, complexity, and cost of the readout apparatus in the present invention, it may be desirable to use a diode laser in place of the Ar ion gas laser, to stimulate the toner luminescence. Such diode lasers are commonly available in the infrared region from 750 to 830 nm, and also in the red visible region at 670 nm. Suitable toner dyes may then be chosen whose absorption spectra match the output of these diode laser sources, and with short fluorescence lifetimes. Dyes used in liquid (dye) lasers are good candidates, since they typically have a good quantum yield of fluorescence, photochemical stability, large Stokes shift between the absorbed and emitted wavelengths, and short fluorescence decay times, usually on the 750–830 nm region include HITC Perchlorate, HITC Iodide, DTTC Perchlorate, DTTC Iodide, IR-144, HDITC Perchlorate, IR-140, IR-132, and IR-125, all available from the Eastman Kodak Company, Rochester, NY. Examples of dyes which absorb in the 670 nm region include DTDC Iodide, DOTC Iodide, HITC Perchlorate, HITC Iodide, DTTC Perchlorate, DTTC Iodide, IR-144, and HDITC Perchlorate, also available from the Eastman Kodak Company, Rochester, NY, and sold as dyes for dye laser applications.

These dyes may be incorporated into a binder and milled to form a powder, as described in the above examples.

Advantages

The present invention is advantageous with respect to conventional film-screen radiography, particularly for applications such as mammography, in that: electronic image data are generated which may be conveniently processed, stored, or transmitted; the latitude for x-ray exposure is greatly increased over that of conventional screen-film systems, since the steps of exposing the photoconductor with x-rays and exposing the output film with light are separated, thus reducing misexposures; conventional tungsten anode x-ray sources rather than dedicated molybdenum anode x-ray sources may be used; and the spatial resolution loss in the x-ray detecting layer can be less since the lateral spreading of charges moving in a charged photoconductor is less than the lateral spreading of photons diffusing through a radiographic phosphor screen.

The present invention is advantageous with respect to conventional xeroradiography in that: it has all the advantages of an electronic detector mentioned above; it requires less x-ray exposure and dose to the patient since the exposure is not determined by the need to achieve a high toner density; it has improved image quality since no transfer of the toned image is required; and it achieves both high spatial resolution and high solid area development through the use of liquid developer and a development electrode.

The present invention is advantageous over other electronic radiography methods known in the art such as storage phosphors in that whereas in the case of storage phosphors the amount of light exposure required to scan out the stored image is very large, being determined by the optical cross section of the electronic storage states which is very small; the corresponding amount of light in the present invention is very small being determined only by the requirement for sufficient SNR in the scanning photodetector. Also, whereas the lifetime of the stimulated luminescence in a storage phosphor material is typically on the order of 1 microsecond, the luminescent lifetime of the dye used in the present invention is much shorter, on the order of 1 present invention may be carried out much more rapidly and with less intense and less expensive light sources than in the prior art. Also the relatively thin toner layer of the present invention compared with the relatively thick phosphor layer of the storage phosphor technique provides improved spatial resolution due to less scattering of the stimulating radiation. Finally, whereas in the prior art method the scanning process was destructive; i.e. the image was erased while being scanned, in the present invention the scanning is nondestructive, which is advantageous in that artifacts such as banding due to nonuniform motion of the scanning spot are much reduced.

We claim:

1. A method of electrographically generating an electrical image signal, comprising the steps of:

a. forming a low amplitude differential voltage pattern;
b. developing the voltage pattern with a luminescent toner to form a low density developed image;
c. exciting the developed image by scanning with a beam of exciting radiation of a first wavelength to emit radiation of a second wavelength; and
d. photoelectrically detecting the emitted radiation to produce an electrical image signal employing a photosensor having a filter for radiation of said second wavelength.

2. The method claimed in claim 1, wherein the luminescent toner has a fluorescent decay lifetime $\tau$ of 0.1 microseconds or less.

3. The method claimed in claim 1, wherein the step of exciting is performed with a diode laser.

4. The method claimed in claim 3, wherein the diode laser emits radiation in the range of 750–830 nm.

5. The method claimed in claim 4 wherein the luminescent toner contains a fluorescent dye selected from the group, HITC Perchlorate, HITC Iodide, DTTC Perchlorate, DTTC Iodide, IR-144, HDITC Perchlorate, IR-140, IR-132 and IR-125.

6. The method claimed in claim 3, wherein the diode laser emits radiation centered at 670 nm.

7. The method claimed in claim 6, wherein the luminescent toner contains a fluorescent dye selected from the group DTDC Iodide, DOTC Iodide, HITC Perchlorate, HITC Iodide, DTTC Perchlorate, DTTC Iodide, IR-144, and HDITC Perchlorate.

8. The method claimed in claim 1, wherein the step of exciting is performed with an argon ion gas laser emitting radiation at 488 nm.

9. The method claimed in claim 8, wherein the luminescent toner contains Rhodamine 6G dye.

10. The method claimed in claim 1, wherein the step of detecting is performed with a light collector/detector having a collector portion for collecting emitted fluorescent radiation and directing it to a detector comprising a photomultiplier tube or photodiode.

11. The method claimed in claim 1, where the image is excited and detected a first time, and the information thus obtained is used to optimally adjust the gain in subsequent, exciting or detecting steps to reduce information loss due to clipping.

12. The method claimed in claim 1, where the toner is applied using a dry developer containing dry toner particles.

13. The method claimed in claim 1, further including the steps of electronically processing the electrical image signal and then printing the image on any of various media by means such as film scanner, xerographic, thermal, or ink jet printer.

14. A method of electrophotographically generating an x-ray image signal, comprising the steps of:
a. exposing a charged photoconductor to an imagewise pattern of x-rays to produce a low amplitude differential voltage pattern;
b. developing the low amplitude differential voltage pattern with a luminescent toner to form a low density toner image;
c. exciting the toner image by scanning with a beam of exciting radiation of a first wavelength to emit radiation of a second wavelength; and
d. photoelectrically detecting the emitted radiation to produce an electrical image signal employing a photosensor having a filter for blocking radiation of said first wavelength and passing radiation of said second wavelength.

15. The method claimed in claim 14, wherein the luminescent toner has a fluorescent decay lifetime $\tau$ of 0.1 microseconds or less.

16. The method claimed in claim 14, wherein the step of exciting is performed with a diode laser.

17. A method claimed in claim 16, wherein the diode laser emits radiation in the range of 750–830 nm.

18. The method claimed in claim 17, wherein
from the group, HITC Perchlorate, HITC Iodide, DTTC Perchlorate, DTTC Iodide, IR-144, HDITC Perchlorate, IR-140, IR-132 and IR-125.

19. The method claimed in claim 16, wherein the diode laser emits radiation centered at 670 nm.

20. The method claimed in claim 19, wherein the luminescent toner contains a fluorescent dye selected from the group DTDC Iodide, DOTC Iodide, HITC Perchlorate, HITC Iodide, DTTC Perchlorate, DTTC Iodide, IR-144, and HDITC Perchlorate.

21. The method claimed in claim 14, wherein the step of exciting is performed with an argon ion 22. The method claimed in claim 21, wherein luminescent toner contains Rhodamine 6G dye.

23. The method claimed in claim 14, wherein the step of detecting is performed with a light collector/detector having a collector portion for collecting emitted fluorescent radiation and directing it to a detector comprising a photomultiplier tube or photodiode.

24. The method claimed in claim 14, where the image is excited and detected a first time, and the information thus obtained is used to optimally adjust the gain in subsequent, exciting or detecting steps to reduce information loss due to clipping.

25. The method claimed in claim 14, where the toner is applied using a dry developer containing dry toner particles.

26. The method claimed in claim 14, further including the steps of electronically processing the electrical image signal and then printing the image on any of various media by means such as film scanner, xerographic, thermal, or ink jet printer.

27. The method claimed in claim 14, further including the step of cleaning the photoconductor for reuse, by mechanical or chemical means, and wherein after the said cleaning operation, the photoconductor is scanned prior to making the next image, and the electrical signal generated by luminescence from any residual toner or toner residue is stored and subtracted from the electrical signal generated by :, the next image made on the same photoconductor.

28. The method claimed in claim 14, wherein the developing step is performed with a liquid developer having a toner particle size between 0.4 and 1 $\mu$m diameter, and the toner particles having a charge such that 1 or more toner particles are deposited per x-ray photon absorbed by the photoconductor, and the developing step is performed with a development electrode.

29. The method claimed in claim 14, where a nonimagewise uniformly developed coverage of luminescent toner on a photoconductor is excited and detected to produce an electrical digitized signal corresponding to a characteristic pattern of noise on the given photoconductor caused by a spatially non-uniform rate of discharge of the photoconductor, the noise signal is stored, and this stored noise pattern signal is adjusted in amplitude and subtracted from electrical image signals subsequently made with the same photoconductor to reduce the noise in these image signals.

30. The method claimed in claim 14, where the photoconductor is selenium.

31. The method claimed in claim 14, where the photoconductor is a selenium alloy.

32. The method claimed in claim 14, wherein the x-ray exposure employed in the exposing step is less than one-half the exposure employed to produce a diagnostically useful image in the photoconductor employing a non-luminescent toner.

33. The method claimed in claim 14, wherein the charged photoconductor is charged to a level lower than that employed with a non-luminescent toner for the same photoconductor.

34. The method claimed in claim 14, wherein the photoconductor is not optimally responsive to the exposing radiation.

35. A method of electrographically generating an electrical image signal, comprising the steps of:
 a. forming a low amplitude differential charge pattern on a dielectric surface by stylus recording, ionography or ion projection;
 b. developing the charge pattern with a luminescent toner;
 c. exciting the developed image by scanning with a beam of exciting radiation of a first wavelength to emit radiation of a second wavelength;
 d. photoelectrically detecting the emitted radiation to produce an electrical image signal employing a photosensor having a filter for blocking radiation of said first wavelength and passing radiation of said second wavelength.

36. The method claimed in claim 35, wherein the luminescent toner has a fluorescent decay lifetime $\tau$ of 0.1 microseconds or less.

37. The method claimed in claim 35, wherein the step of exciting is performed with a diode laser.

38. The method claimed in claim 37 wherein the diode laser emits radiation in the range of 750–830 nm.

39. The method claimed in claim 38, wherein the luminescent toner contains a fluorescent dye selected from the group, HITC Perchlorate, HITC Iodide, DTTC Perchlorate, DTTC Iodide, IR-144, HDITC Perchlorate, IR-140, IR-132 and IR-125.

40. The method claimed in claim 37, wherein the diode laser emits radiation centered at 670 nm.

41. The method claimed in claim 40, wherein the luminescent toner contains a fluorescent dye selected from the group DTDC Iodide, DOTC Iodide, HITC Perchlorate, HITC Iodide, DTTC Perchlorate, DTTC Iodide, IR-144, and HDITC Perchlorate.

42. The method claimed in claim 35, wherein the step of exciting is performed with an argon ion gas laser emitting radiation at 488 nm.

43. The method claimed in claim 42, wherein the luminescent toner contains Rhodamine 6G dye.

44. The method claimed in claim 35, wherein the step of detecting is performed with a light collector/detector having a collector portion for collecting emitted fluorescent radiation and directing it to a detector comprising a photomultiplier tube or photodiode.

45. The method claimed in claim 35, where the image is excited and detected a first time, and the information thus obtained is used to optimally adjust the gain in subsequent, exciting or detecting steps to reduce information loss due to clipping.

46. The method claimed in claim 35, where the toner is applied as a dry developer containing dry toner particles.

47. The method claimed in claim 35, further including the steps of electronically processing the electrical image signal and then printing the image on any of various media by means such as film scanner, xerographic, thermal, or ink jet printer.

48. A method of electrographically generating an electrical image signal, comprising the steps of:
 a. forming a low density photoelectrophoretic image on a receiver by means of a photoactive, luminescent toner;
 b. exciting the toner image on the receiver by scanning with a beam of exciting radiation of a first wavelength to emit radiation of a second wavelength;
 c. photoelectrically detecting the emitted radiation to produce an electric image signal employing a photosensor having a filter for blocking radiation of said first wavelength and passing radiation of said second wavelength.

49. The method claimed in claim 48, wherein the luminescent toner has a fluorescent decay lifetime $\tau$ of 0.1 microseconds or less.

50. The method claimed in claim 48, wherein the step of exciting is performed with a diode laser.

51. The method claimed in claim 50, wherein the diode laster emits radiation in the range of 750–830 nm.

52. The method claimed in claim 51, wherein the luminescent toner contains a fluorescent dye selected from the group, HITC Perchlorate, HITC Iodide, DTTC Perchlorate, DTTC Iodide, IR-144, HDITC Perchlorate, IR-140, IR-132, and IR-125.

53. The method claimed in claim 50, wherein the diode laser emits radiation centered at 670 nm.

54. The method claimed in claim 53, wherein the luminescent toner contains a fluorescent dye selected from the group DTDC Iodide, DOTC Iodide, HITC Perchlorate, HITC Iodide, DTTC Perchlorate, DTTC Iodide, IR-144, and HDITC Perchlorate.

55. The method claimed in claim 48, wherein the step of exciting is performed with an argon ion gas laser emitting radiation at 488 nm.

56. The method claimed in claim 55, wherein the luminescent toner contains Rhodamine 6G dye.

57. The method claimed in claim 48, wherein the step of detecting is performed with a light collector/detector having a collector portion for collecting emitted fluorescent radiation and directing it to a detector comprising a photomultiplier tube or photodiode.

58. The method claimed in claim 48, where the image is excited and detected a first time, and the information thus obtained is used to optimally adjust the gain is subsequent, exciting or detecting steps to reduce information loss due to clipping.

59. The method claimed in claim 48, further including the steps of electronically processing the electrical image signal and then printing the image on any of various media by means such as film scanner, xerographic, thermal, or ink jet printer.

60. A method of electrophotographically generating an electrical image signal comprising the steps of:
 a. exposing a charged photoconductor to an imagewise pattern of radiation to produce a low amplitude voltage pattern;

b. developing the low amplitude voltage pattern with a luminescent toner to form a low density developed image;

c. exciting the low density developed image by scanning a beam of exciting radiation of a first wavelength to emit radiation of a second wavelength; and d. photoelectrically detecting the emitted radiation to produce an electrical image signal employing a photosensor with a filter for blocking radiation of said first wavelength and passing radiation of said second wavelength.

61. The method claimed in claim 60, wherein the luminescent toner has a fluorescent decay lifetime $\tau$ of about 0.1 microseconds or less.

62. The method claimed in claim 60, wherein the step of exciting is performed with a diode laser.

63. The method claimed in claim 60, wherein the diode laser emits radiation in the range of 750–830 nm.

64. The method claimed in claim 63, wherein the luminescent toner contains a fluorescent dye selected from the group, HITC Perchlorate, HITC Iodide, DTTC Perchlorate, DTTC Iodide, IR-144, HDITC Perchlorate, IR-140, IR-132, and IR-125.

65. The method claimed in claim 62, wherein the diode laser emits radiation centered at 670 nm.

66. The method claimed in claim 65, wherein the luminescent toner contains a fluorescent dye selected from the group DTDC Iodide, DOTC Iodide, HITC Perchlorate, HITC Iodide, DTTC perchlorate, DTTC Iodide, IR-144, and HDITC Perchlorate.

67. The method claimed in claim 60, wherein the step of exciting is performed with an argon ion gas laser emitting radiation at 488 nm.

68. The method claimed in claim 67, wherein the luminescent toner contains Rhodamine 6G dye.

69. The method claimed in claim 60, wherein the step of detecting is performed with a light collector/detector having a collector portion for collecting emitted fluorescent radiation and directing it to a detector comprising a photomultiplier tube or photodiode.

70. The method claimed in claim 60, where the image is excited and detected a first time, and the information thus obtained is used to optimally adjust the gain in subsequent, exciting or detecting steps to reduce information loss due to clipping.

71. The method claimed in claim 62, where the toner is applied as a dry developer containing dry toner particles.

72. The method claimed in claim 60, wherein including the steps of electronically processing the electrical image signal and then printing the image on any of various media by means such as film scanner, xerographic, thermal, or ink jet printer.

73. The method claimed in claim 60, where the photoconductor is selenium or a selenium alloy.

74. The method claimed in claim 60, where the photoconductor is an organic photoconductor film.

75. The method claimed in claim 60, wherein the charged photoconductor is charged to a level lower than that employed with a non-luminescent toner for the same photoconductor.

76. The method claimed in claim 60, wherein the photoconductor is an organic photoconductor in a binder, and the amount of organic photoconductor in the binder is below that employed with a non-luminescent toner.

77. The method claimed in claim 60, wherein the photoconductor is not optimally responsive to the exposing radiation.

78. The method claimed in claim 62, where the exposure employed in the exposing step is less than one-half the exposure employed with a non-luminescent toner to produce a useful image.

79. A method of performing x-ray mammography, comprising:

a. exposing a charged selenium photoconductor to an image-wise pattern of x-radiation, to produce a low amplitude differential voltage pattern;

b. developing the low amplitude voltage pattern with a luminescent toner having a fluorescent decay lifetime less than 0.1 $\mu$ seconds, to form a low density developed image;

c. exciting the low density developed image by scanning with a beam of exciting radiation of a first wavelength to emit radiation of a second wavelength; and d. photoelectrically detecting the emitted radiation to produce an electrical image signal, employing a photosensor having a light collector for collecting light over a wide solid angle, a light detector, and a filter for blocking light of said first wavelength and passing light of said second wavelength.

80. The method claimed in claim 79, wherein the luminescent toner has a fluorescent decay lifetime $\tau$ of 1 nanosecond or less.

81. The method claimed in claim 79, wherein the step of exciting is performed with a diode laser.

82. The method claimed in claim 81, wherein the diode laser emits radiation in the range of 750–830 nm.

83. The method claimed in claim 82, wherein the luminescent toner contains a fluorescent dye selected from the group HITC Perchlorate, HITC Iodide, DTTC Perchlorate, DTTC Iodide, IR-144, HDITC Perchlorate, IR-140, IR-132, and IR-125.

84. The method claimed in claim 81, wherein the diode laser emits radiation centered at 670 nm.

85. The method claimed in claim 84, wherein the luminescent toner contains a fluorescent dye selected from the group DTDC Iodide, DOTC Iodide, HITC Perchlorate, HHITC Iodide, DTTC Perchlorate, DTTC Iodide, IR-144, and HDITC Perchlorate.

86. The method claimed in claim 79, wherein the step of exciting is performed with an argon ion gas laser emitting radiation of 488 nm.

87. The method claimed in claim 86, wherein the luminescent toner contains Rhodamine 6G dye.

88. The method claimed in claim 79, where the image is excited and detected a first time, and the information thus obtained is used to optimally adjust the gain in subsequent, exciting or detecting steps to reduce information loss due to clipping.

89. The method claimed in claim 79, further including the steps of electronically processing the electrical image signal and then printing the image on any of various media by means such as film scanner, xerographic, thermal, or ink jet printer.

90. The method claimed in claim 79, wherein the developing step is performed with a liquid developer having a toner particle size between 0.4 and 1 $\mu$m diameter, and the toner particles having a charge such that 1 or more toner particles are deposited per x-ray photon absorbed by the photoconductor, and the developing step is performed with a development electrode.

91. The method claimed in claim 79, wherein the x-ray exposure employed in the exposing step is less than one-half the exposure employed to produce a diagnostically useful image in the photoconductor employing a non-luminescent toner.

92. The method claimed in claim 79, where a non-imagewise uniformly developed coverage of luminescent toner on a photoconductor is excited and detected to produce an electrical digitized signal corresponding to a characteristic pattern of noise on the given photoconductor caused by a spatially non-uniform rate of discharge of the photoconductor, the noise signal is stored, and this stored noise pattern signal is subtracted from electrical image signals subsequently made with the same photoconductor to reduce the noise in these image signals.

* * * * *

UNITED STATES PATENT AND TRADEMARK OFFICE
CERTIFICATE OF CORRECTION

PATENT NO. : 5,105,451
DATED : April 14, 1992
INVENTOR(S) : Anthony R. Lubinsky, and John W. May It is certified that error appears in the above-indentified patent and that said Letters Patent is hereby corrected as shown below:

Column 1, line 50, after "ionography" insert --stylus recording, and ion projection.--

Column 2, line 3, after "the" insert -scanning beam, the modulation is weak and difficult--.

Column 2, line 32, after "suffers" insert --from the drawback that it is a destructive readout--.

Column 2, line 38, after "the" (second instance), insert --present invention to provide a method of generating--.

Column 2, line 45, after "stylus" insert --recording, ion projection and photoelectrophoresis or any related process in which a weak differential pattern--.

Column 2, line 55, after "different" insert --wavelength. Luminescent materials include phosphors,--.

Column 3, line 6, after "tube," insert --photodiode, or other detector, where it is detected to--.

Column 3, line 41, after "to" insert --give low coverages of luminescent toner, thereby--.

Column 4, line 17, after "than" insert --normal intensities of radiation to produce the latent--.

Column 4, line 20, after "by" insert --making use of the amplification provided by the--.

Column 4, line 61, change "lattices" to --latices--.

Column 4, line 62, after "optical" insert --brighteners, luminescent metal chelates, or--.

Column 5, line 40, change "s-rays" to --x-rays--.

Column 6, line 14, after "that" insert --the readout of the image can be conducted in a--.

UNITED STATES PATENT AND TRADEMARK OFFICE
CERTIFICATE OF CORRECTION

PATENT NO. : 5,105,451
DATED : April 14, 1992
INVENTOR(S) : Anthony R. Lubinsky, and John W. May It is certified that error appears in the above-indentified patent and that said Letters Patent is hereby corrected as shown below:

Column 6, line 16, after "(not shown)" insert --with an inert hydrocarbon liquid such as the toner--.

Column 6, line 20, after "is" insert --excited (14) by scanning with a beam of stimulating--.

Column 8, line 11, after "methacrylate" insert --as described in U.S. Patent 3,788,995 producing a liquid developer having particle size smaller than--.

Column 9, line 44, after "pigment" insert --(solid solution of dye in binder). This was--.

Column 9, line 45, change "F20" to --20--.

Column 11, line 23, after "than" insert --reported in the present Example--.

Column 12, line 68, equation should read --$MTF(\upsilon)=[1+2\pi i x_a \upsilon]^{-1}$--.

Column 13, line 36, after "function" insert --.--.

Column 13, line 64, after "the" insert --order of nanoseconds or less. Dyes which absorb in the--.

Column 14, line 52, after "1" insert --nanosecond or less. Thus the scanning process in the--.

Column 16, line 10, after "wherein" insert --the luminescent toner contains a fluorescent dye selected--.

Column 16, line 22, after "ion" insert --gas laser emitting radiation at 488 nm.--

Column 16, line 51, after "by" delete --:,--.

Column 18, line 56, change "is" to --in--.

UNITED STATES PATENT AND TRADEMARK OFFICE
CERTIFICATE OF CORRECTION

PATENT NO. : 5,105,451

DATED : April 14, 1992

INVENTOR(S) : Anthony R. Lubinsky, and John W. May

It is certified that error appears in the above-indentified patent and that said Letters Patent is hereby corrected as shown below:

Column 19, line 48, change "62" to --60--.

Signed and Sealed this

Second Day of November, 1993

Attest:

BRUCE LEHMAN

Attesting Officer

Commissioner of Patents and Trademarks